(12) United States Patent
Swanson et al.

(10) Patent No.: US 12,009,449 B2
(45) Date of Patent: Jun. 11, 2024

(54) SOLAR CELL HAVING AN EMITTER REGION WITH WIDE BANDGAP SEMICONDUCTOR MATERIAL

(71) Applicant: Maxeon Solar Pte. Ltd., Singapore (SG)

(72) Inventors: Richard M. Swanson, Los Altos, CA (US); Marius M. Bunea, Santa Clara, CA (US); Michael C. Johnson, Alameda, CA (US); David D. Smith, Campbell, CA (US); Yu-Chen Shen, Sunnyvale, CA (US); Peter J. Cousins, Los Altos, CA (US); Tim Dennis, Canton, TX (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/107,917

(22) Filed: Feb. 9, 2023

(65) Prior Publication Data
US 2023/0197877 A1 Jun. 22, 2023

Related U.S. Application Data

(60) Division of application No. 17/183,164, filed on Feb. 23, 2021, now Pat. No. 11,605,750, which is a
(Continued)

(51) Int. Cl.
*H01L 21/00* (2006.01)
*H01L 31/0216* (2014.01)
(Continued)

(52) U.S. Cl.
CPC .... *H01L 31/0747* (2013.01); *H01L 31/02167* (2013.01); *H01L 31/022441* (2013.01);
(Continued)

(58) Field of Classification Search
CPC .......... H10L 31/0747; H10L 31/02167; H10L 31/02241; H10L 31/02363; H10L 31/068;
(Continued)

(56) References Cited

U.S. PATENT DOCUMENTS 6,177,302 B1 1/2001 Yamazaki et al.
7,737,357 B2 6/2010 Cousins
(Continued)

FOREIGN PATENT DOCUMENTS

CN 104011881 8/2014
EP 2339648 6/2011
(Continued)

OTHER PUBLICATIONS

U.S. Appl. No. 13/333,908, filed Dec. 21, 2011, 25 pgs.
(Continued)

*Primary Examiner* — Richard A Booth
(74) *Attorney, Agent, or Firm* — Schwabe, Williamson & Wyatt, P.C.

(57) ABSTRACT

Solar cells having emitter regions composed of wide bandgap semiconductor material are described. In an example, a method includes forming, in a process tool having a controlled atmosphere, a thin dielectric layer on a surface of a semiconductor substrate of the solar cell. The semiconductor substrate has a bandgap. Without removing the semiconductor substrate from the controlled atmosphere of the process tool, a semiconductor layer is formed on the thin dielectric layer. The semiconductor layer has a bandgap at least approximately 0.2 electron Volts (eV) above the bandgap of the semiconductor substrate.

22 Claims, 8 Drawing Sheets

Related U.S. Application Data continuation of application No. 16/692,890, filed on Nov. 22, 2019, now Pat. No. 10,957,809, which is a continuation of application No. 16/230,968, filed on Dec. 21, 2018, now Pat. No. 10,490,685, which is a continuation of application No. 14/945,708, filed on Nov. 19, 2015, now Pat. No. 10,170,657, which is a continuation of application No. 14/706,773, filed on May 7, 2015, now Pat. No. 9,219,173, which is a continuation of application No. 13/429,138, filed on Mar. 23, 2012, now Pat. No. 9,054,255.

(51) Int. Cl.

| H01L 31/0224 | (2006.01) |
|---|---|
| H01L 31/0236 | (2006.01) |
| H01L 31/068 | (2012.01) |
| H01L 31/072 | (2012.01) |
| H01L 31/0745 | (2012.01) |
| H01L 31/0747 | (2012.01) |
| H01L 31/18 | (2006.01) |

(52) U.S. Cl.
CPC ...... *H01L 31/02363* (2013.01); *H01L 31/068* (2013.01); *H01L 31/0682* (2013.01); *H01L 31/072* (2013.01); *H01L 31/0745* (2013.01); *H01L 31/18* (2013.01); *H01L 31/1804* (2013.01); *Y02E 10/547* (2013.01); *Y02P 70/50* (2015.11)

(58) Field of Classification Search
CPC ............... H10L 31/0682; H10L 31/072; H10L 31/0745; H10L 31/18; H10L 31/1804
See application file for complete search history.

(56) References Cited

U.S. PATENT DOCUMENTS

| 7,786,376 | B2 | 8/2010 | Nag et al. |
|---|---|---|---|
| 8,551,866 | B2 | 10/2013 | Moslehi et al. |
| 8,597,970 | B2 | 12/2013 | Cousins et al. |
| 8,637,340 | B2 | 1/2014 | Moslehi et al. |
| 8,679,889 | B2 | 3/2014 | Cousins et al. |
| 9,219,173 | B2 | 12/2015 | Swanson et al. |
| 10,170,657 | B2 | 1/2019 | Swanson et al. |
| 2006/0255340 | A1 | 11/2006 | Manivannan et al. |
| 2008/0047601 | A1 | 2/2008 | Nag et al. |
| 2009/0081842 | A1 | 3/2009 | Nelson et al. |
| 2009/0173373 | A1 | 7/2009 | Walukiewicz et al. |
| 2009/0288704 | A1 | 11/2009 | Borden |
| 2009/0301557 | A1 | 12/2009 | Agostinelli et al. |
| 2009/0308438 | A1 | 12/2009 | De Ceuster et al. |
| 2010/0015756 | A1 | 1/2010 | Weidman et al. |
| 2010/0300518 | A1 | 12/2010 | Moslehi et al. |
| 2010/0304521 | A1 | 12/2010 | Seutter et al. |
| 2011/0056545 | A1 | 3/2011 | Ji et al. |
| 2011/0136285 | A1 | 6/2011 | Kim |
| 2011/0237023 | A1 | 9/2011 | Lim |
| 2011/0272012 | A1 | 11/2011 | Heng et al. |
| 2011/0299167 | A1 | 12/2011 | Woolf |
| 2011/0303278 | A1 | 12/2011 | Fu et al. |
| 2012/0073658 | A1 | 3/2012 | Tomita |
| 2012/0122272 | A1 | 5/2012 | Rana et al. |
| 2012/0171804 | A1 | 7/2012 | Moslehi et al. |
| 2012/0178203 | A1 | 7/2012 | Moslehi et al. |
| 2012/0225515 | A1 | 9/2012 | Moslehi et al. |
| 2012/0266951 | A1 | 10/2012 | Li et al. |
| 2013/0112275 | A1 | 5/2013 | Hkematshoar-Tabari |
| 2013/0130430 | A1 | 5/2013 | Moslehi et al. |
| 2013/0140838 | A1 | 6/2013 | Wang et al. |
| 2013/0164883 | A1 | 6/2013 | Moslehi et al. |
| 2013/0167915 | A1 | 7/2013 | Moslehi et al. |
| 2013/0213469 | A1 | 8/2013 | Moslehi et al. |
| 2013/0228221 | A1 | 9/2013 | Moslehi et al. |
| 2013/0233378 | A1 | 9/2013 | Moslehi et al. |
| 2013/0319520 | A1 | 12/2013 | Moslehi et al. |
| 2014/0017846 | A1 | 1/2014 | Moslehi et al. |
| 2014/0020752 | A1 | 1/2014 | Arimoto et al. |

FOREIGN PATENT DOCUMENTS

| JP | H01289271 | 11/1989 |
|---|---|---|
| JP | 2003298078 | 10/2003 |
| JP | 2008533730 | 8/2008 |
| JP | 2009535845 | 10/2009 |
| JP | 2012054424 | 3/2012 |
| JP | 2012060080 | 3/2012 |
| TW | 200947725 | 11/2009 |
| TW | 201128796 | 8/2011 |
| WO | WO 03083955 | 10/2003 |
| WO | WO 2005093856 | 10/2005 |
| WO | WO 2006135443 | 12/2006 |
| WO | WO 2009094578 | 7/2009 |
| WO | WO 2011076753 | 6/2011 |

OTHER PUBLICATIONS

U.S. Appl. No. 13/333,904, filed Dec. 21, 2011, 25 pgs.
International Search Report and Written Opinion from PCT/US2012/070711 dated Apr. 25, 2013, 11 pgs.
First Action Interview Office Action from U.S. Appl. No. 13/429,138 dated Sep. 24, 2014, 4 pgs.
International Preliminary Report on Patentability from PCT/US2012/070711 dated Oct. 2, 2014, 8 pgs.
Extended European Search Report from EP Patent Application No. 12871937.4 dated Apr. 8, 2015, 9 pgs.
Non-Final Office Action for Mexico Patent Application No. MX/a/2014/011246 dated Nov. 3, 2015, 2 pgs.
1$^{st}$ Office Action for China Patent Application No. 201280071731.4 dated Dec. 4, 2015, 12 pgs.
First Action Interview Pilot Program Pre-Interview Communication from U.S. Appl. No. 14/945,708 dated Jul. 14, 2016, 18 pgs.
Second Office Action for China Patent Application No. 201280071731.4 dated Jul. 19, 2016, 8 pgs.
Non-Final Office Action for Japanese Patent Application No. 2015-501665 dated Nov. 22, 2016, 6 pgs.
Non-Final Office Action for Japanese Patent Application No. 2015-501665 dated Mar. 7, 2017, 2 pgs.
Final Office Action from U.S. Appl. No. 14/945,708 dated Jul. 12, 2017, 10 pgs.
Non-Final Office Action for U.S. Appl. No. 14/945,708 dated Nov. 2, 2017, 15 pgs.
Notice of First Office Action from Japanese Patent Application No. 2017-112826 dated Nov. 14, 2017, 7 pgs.
Final Rejection from Japanese Patent Application No. 2017-112826 dated Feb. 8, 2018, 3 pgs.
Examination Report from Malaysian Patent Application No. PI2014002689 dated Feb. 28, 2018, 4 pgs.
Notice of Preliminary Rejection (Non-Final) for Korean Patent Application No. 10-2014-7029299 dated Sep. 5, 2018, 6 pgs.
Second Office Action from Chinese Patent Application No. 2016102067382 dated Jan. 26, 2018, 5 pgs.
Final Office Action from U.S. Appl. No. 14/945,708 dated Apr. 26, 2018, 23 pgs.
Non-Final Notice of Reasons for Rejection for Japanese Application No. 2018-073440, dated Mar. 29, 2019, 7 pgs.
First Examination Report from European Patent Application No. 12871937.4 dated Jun. 12, 2019, 6 pgs.
Non-Final Notice of Preliminary Rejection from Korean Patent Application No. 10-2019-7017292 dated Aug. 5, 2019, 4 pgs.
Decision of Refusal from Japanese Patent Application No. 2018-073440 dated Nov. 22, 2019, 5 pgs.
Preliminary Office Action from Brazilian Patent Application No. 112014023047-1 dated Apr. 13, 2020, 5 pgs.
Notice of Non-Final Office Action from Korean Patent Application No. 10-2020-7017292 dated May 8, 2020, 4 pgs.

(56) References Cited

OTHER PUBLICATIONS

First Action Interview Pre-Interview Communication from U.S. Appl. No. 16/692,890 dated May 12, 2020, 9 pgs.
First Action Interview Office Action U.S. Appl. No. 16/692,890 dated Aug. 18, 2020, 8 pgs.
Summons to Attend Oral Proceedings from European Patent Application No. 12871937.4 dated May 20, 2021, 10 pgs.
Goetzberger A: "Photovoltaic Solar Energy Generation" In: "Optical Sciences," Jan. 1, 2005, Springer, XP055777797, ISBN: 978-3-540-23676-4, pp. 1-2. Chapter 1; 1.1, What is Photovoltaics?
Mingirulli, Nicola, et al.: "Efficient interdigitated back-contacted silicon heterojunction solar cells," physica status solidi (RRL)—Rapid Research Letters, vol. 5 No. 4, Apr. 1, 2011, pp. 159-161, XP055009090, ISSN: 1862-6254, DOI: 10.1002/pssr.201105056.
Desrues, Thibaut, et al.: "Development of Interdigitated Back Contact Silicon Heterojunction (IBC Si-HJ) Solar Cells," Energy Procedia, vol. 8, pp. 294-300, XP028263081, ISSN: 1876-6102, DOI: 10.1016/J.EGYPRO.2011.06.139.
Desrues, T., et al.: "B-doped a-Si:H contact improvement on silicon heterojunction solar cells and interdigitated back contact structure," Physica Status Solidi, C: Current Topics in Solid State Physics, Jan. 27, 2010, pp. 1011-1015, XP05580240,DE, ISSN: 1862-6351, DOI: 10.1002/pssc.200982766.
First Action Interview Pre-Interview Communication from U.S. Appl. No. 17/183,164 dated Mar. 28, 2022, 4 pgs.
Substantive Examination Adverse Report from Malaysian Patent Application No. PI201800829 dated May 26, 2022, 2 pgs.
First Action Interview Office Action from U.S. Appl. No. 17/183,164 dated Aug. 22, 2022, 21 pgs.

SOLAR CELL HAVING AN EMITTER REGION WITH WIDE BANDGAP SEMICONDUCTOR MATERIAL

CROSS-REFERENCE TO RELATED APPLICATIONS

This application is a divisional of U.S. patent application Ser. No. 17/183,164, filed on Feb. 23, 2021, which is a continuation of U.S. patent application Ser. No. 16/692,890, filed on Nov. 22, 2019, now U.S. Pat. No. 10,957,809, issued on Mar. 23, 2021, which is a continuation of U.S. patent Ser. No. 16/230,968, filed on Dec. 21, 2018, now U.S. Pat. No. 10,490,685, issued on Nov. 26, 2019, which is a continuation of Ser. No. 14/945,708, filed on Nov. 19, 2015, now U.S. Pat. No. 10,170,657, issued on Jan. 1, 2019, which is a continuation of Ser. No. 14/706,773, filed on May 7, 2015, now U.S. Pat. No. 9,219,173, issued on Dec. 22, 2015, which is a continuation of U.S. patent application Ser. No. 13/429,138, filed on Mar. 23, 2012, now U.S. Pat. No. 9,054,255, issued on Jun. 9, 2015, the entire contents of which are hereby incorporated by reference herein.

TECHNICAL FIELD

Embodiments of the present invention are in the field of renewable energy and, in particular, solar cells having emitter regions composed of wide bandgap semiconductor material.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present invention allow for increased solar cell manufacture efficiency by providing novel processes for fabricating solar cell structures. Some embodiments of the present invention allow for increased solar cell efficiency by providing novel solar cell structures.

DETAILED DESCRIPTION

Solar cells having emitter regions composed of wide bandgap semiconductor material are described herein. In the following description, numerous specific details are set forth, such as specific process flow operations and material regimes, in order to provide a thorough understanding of embodiments of the present invention. It will be apparent to one skilled in the art that embodiments of the present invention may be practiced without these specific details. In other instances, well-known fabrication techniques, such as subsequent metal contact formation techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of fabricating solar cells. In one embodiment, a method includes forming, in a process tool having a controlled atmosphere, a thin dielectric layer on a surface of a semiconductor substrate of the solar cell. The semiconductor substrate has a bandgap. Without removing the semiconductor substrate from the controlled atmosphere of the process tool, a semiconductor layer is formed on the thin dielectric layer. The semiconductor layer has a bandgap at least approximately 0.2 electron Volts (eV) above the bandgap of the semiconductor substrate.

Also disclosed herein are solar cells having emitter regions composed of wide bandgap semiconductor material. In one embodiment, a solar cell includes a silicon substrate. A first emitter region is disposed on a surface of the silicon substrate and is composed of an aluminum nitride (AlN) layer doped to a first conductivity type. The AlN layer is disposed on a thin aluminum oxide ($Al_2O_3$) layer. A second emitter region is disposed on the surface of the silicon substrate and is composed of a semiconductor material doped to a second, opposite, conductivity type. The second semiconductor material is disposed on a thin dielectric layer. First and second contacts are disposed on, and conductively coupled to, the first and second emitter regions, respectively.

Passivation of solar cells surfaces is typically accomplished with diffusion and oxidation to form a thin dielectric material on one or more surfaces of the solar cell. Forming such a thin dielectric material may provide a structural approach to repelling minority carriers at a surface of the solar cell. Furthermore, the oxidation process may be designed to effectively tie-up interface defects that may exist at the outer most surfaces of the solar cell. The formed dielectric material may have several functions such as, but not limited to, use as a moisture barrier, use as a hydrogen source and, possibly, use as an anti-reflection coating.

The above three aspects of solar cell surface passivation are typically achieved in two or more process operation during the fabrication of the solar cell. However, using multiple process operations may invoke a new set of issues, namely, handling complexity and increased processing cost. Also, typically, is an oxide and diffusion operation are performed in one tool (e.g., in a diffusion furnace), then the dielectric formation is generally performed in a separate process tool. Unfortunately, when the formed oxide is removed from the first process tool (e.g., the furnace) the oxide may be exposed to the atmospheric conditions and contaminants, such as moisture. Accordingly, in an embodiment of the present invention, a high quality oxide is formed and then inhibited from exposure to air and water prior to performing further processing operations.

Diffusion followed by dielectric deposition often involves multiple process tooling at a relatively high cost. Thus, in an embodiment, a silicon passivation operation is performed by growth of a thin, e.g., less than approximately 3 nanometers (and, possibly, less than approximately 2 nanometers) silicon oxide layer in a controlled atmosphere furnace tool. Within the same tool (and, specifically, without exposure to outside lab or fab atmospheric or ambient conditions), deposition of a doped wide bandgap semiconductor on the thin oxide layer follows. In one such embodiment, the furnace is either a low pressure chemical vapor deposition (CVD) furnace or a rapid thermal anneal, or rapid thermal processing (RTP) tool. In a specific embodiment, the oxide growth and deposition occurs on both sides of a substrate or wafer ultimately used to form a solar cell. In an embodiment, the film deposited on the oxide layer is wide bandgap semiconductor material, e.g., with a bandgap greater than approximately 3 electron Volts (eV), having one or more of a large valence band offset, moisture barrier properties, a low stress on silicon, and the ability to be contacted ohmically. Polycrystalline silicon is often coupled with a silicon substrate, but may not be most suitable for blocking minority carriers. By contrast, in an embodiment, the wide bandgap semiconductor material both blocks minority carriers and is highly conducting for majority carriers.

In an embodiment, wide bandgap materials are considered relative to a silicon substrate and may include, but are not limited to, doped amorphous-silicon, silicon carbide, or aluminum gallium nitride, as described in greater detail below. Doped polysilicon is another option that has been previously disclosed. Doped amorphous-silicon may be a good selection for passivation and ohmic contact. In one embodiment, the doped amorphous-silicon used is formed sufficiently thin to minimize optical absorption. In another embodiment, even higher bandgap materials are used to facilitate optical transmission on a light-receiving surface of a substrate, as described in greater details below. In an embodiment, a vacuum tool configuration with a tube low pressure chemical vapor deposition (LPCVD) reactor that can reach high temperatures, e.g., approximately 900 degrees Celsius, is used to form both an oxide and an overlying wide bandgap semiconductor material. In another embodiment, an RTP tool combined with a plasma enhanced CVD (PECVD) tool is used to form both an oxide and an overlying wide bandgap semiconductor material. Other possible embodiments are described in greater detail below.

Figure 1:
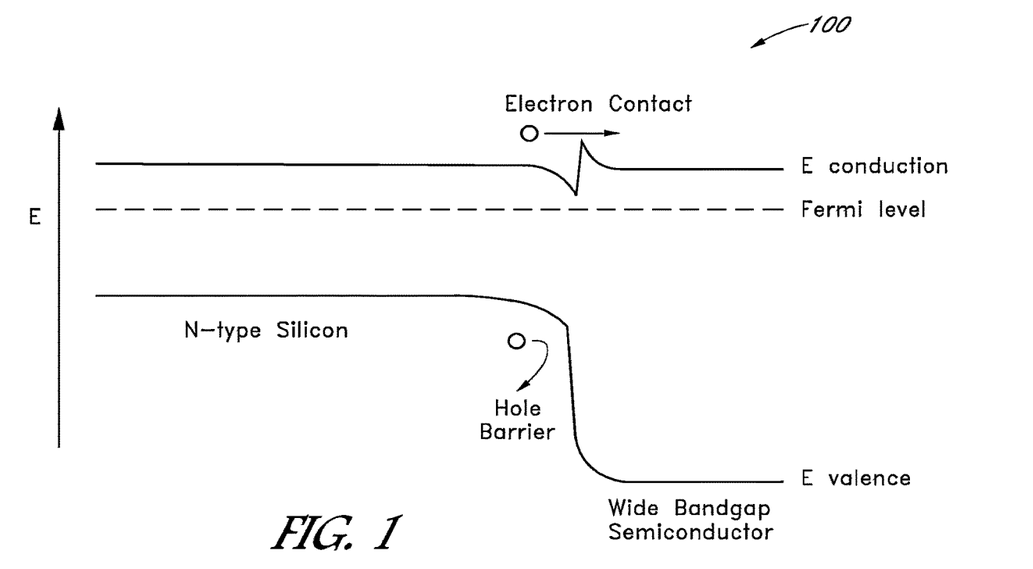
FIG. 1 illustrates a band diagram as a function of increasing energy (E) for a conventional heterojunction contact without an interfacial tunnel oxide.

To better illustrate some of the concepts involved pertaining to at least some of the embodiments described herein, FIG. 1 illustrates a band diagram as a function of increasing energy (E) for a conventional heterojunction contact without an interfacial tunnel oxide. Referring to FIG. 1, the band diagram 100 of a conventional N-type substrate and wide bandgap passivation/contact showing valence energy level (Evalence), Fermi level, and conduction energy level (Econduction) for electrons (majority carriers) and holes (minority carriers). Superior passivation may be achieved with a large minority carrier band offset, and superior ohmic contact may be achieved with a small majority carrier offset. However, it often proves difficult to fabricate a high bandgap material directly on a silicon substrate.

Figure 2:
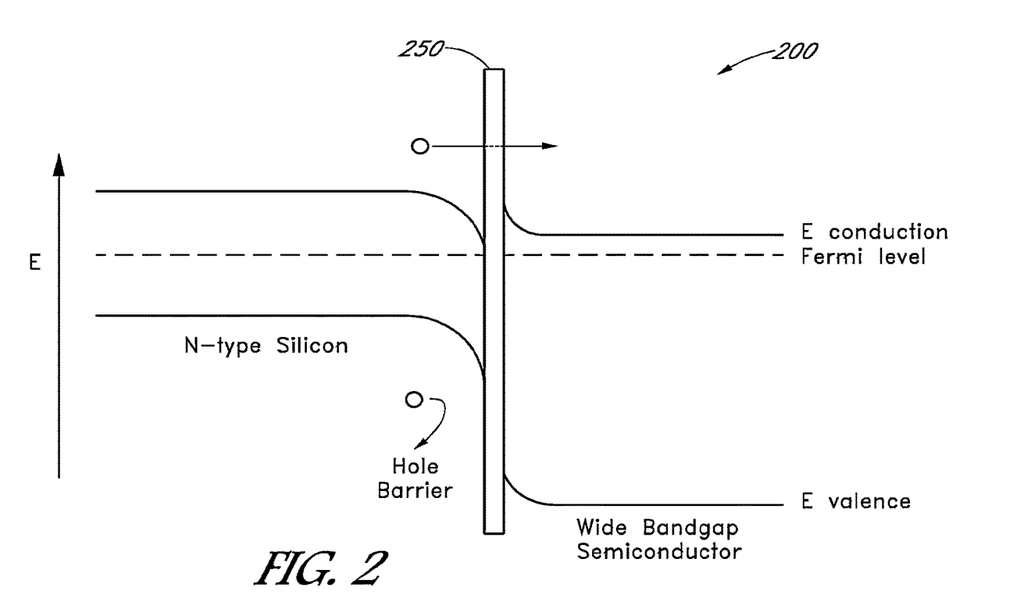
FIG. 2 illustrates a band diagram as a function of increasing energy (E) for a heterojunction contact with an interfacial tunnel oxide, in accordance with an embodiment of the present invention.

In comparison, FIG. 2 illustrates a band diagram as a function of increasing energy (E) for a heterojunction contact with an interfacial tunnel oxide, in accordance with an embodiment of the present invention. Referring to FIG. 2, the band diagram 200 of an N-type substrate and wide bandgap passivation/contact with a thin interfacial tunnel oxide there between showing valence energy level (Evalence), Fermi level, and conduction energy level (Econduction) for electrons (majority carriers) and holes (minority carriers) is provided. In an embodiment, an interfacial oxide (e.g., a thin layer of $SiO_2$) 250 is provided to aid in the lowering of surface defect density. That is, in one embodiment, a thin dielectric (e.g., a tunneling oxide layer) is included between a silicon substrate and wide bandgap semiconductor interface to tie up surface states. In a specific embodiment, the passivation of the silicon substrate by dielectric 250 provides an interface with less than approximately $10^{12}$ defects/cm². In an embodiment, even with the inclusion of such a dielectric layer, the Fermi level is near the band edge, as depicted in FIG. 2.

Figure 3:
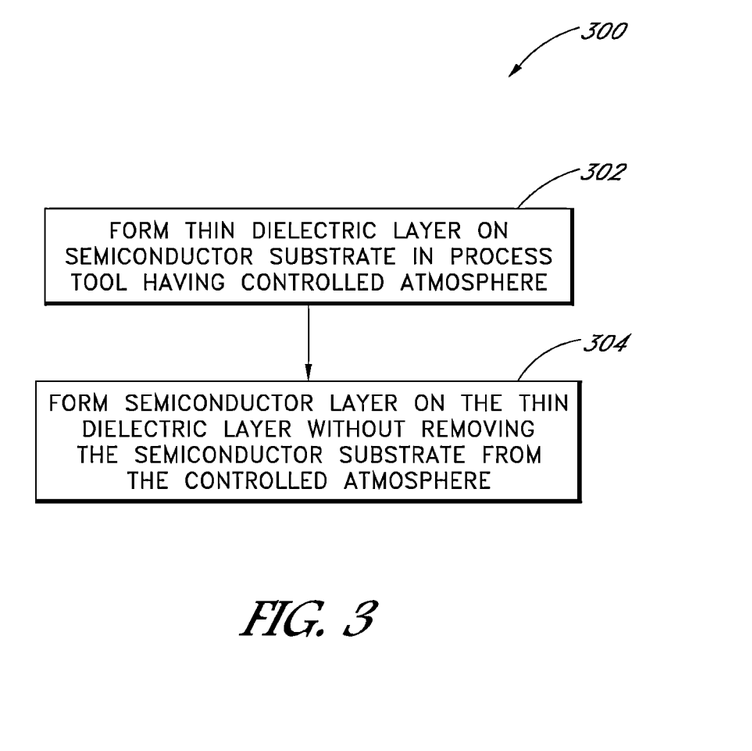
FIG. 3 is a flowchart representing operations in a method of fabricating a solar cell, in accordance with an embodiment of the present invention.

There are possibly many processing schemes that may be suitable for providing a solar cell having a wide bandgap semiconductor material above a surface of a semiconductor substrate, with an interfacial dielectric and/or passivation layer disposed there between. As a basic example of such a process scheme, FIG. 3 is a flowchart 300 representing operations in a method of fabricating a solar cell, in accordance with an embodiment of the present invention. Referring to operation 302 of flowchart 300, a method of fabricating a solar cell includes forming a thin dielectric layer on a surface of a semiconductor substrate of the solar cell. The thin dielectric layer is formed in a process tool having a controlled atmosphere. Referring to operation 304 of flowchart 300, the method then includes forming a semiconductor layer on the thin dielectric layer without removing the semiconductor substrate from the controlled atmosphere of the process tool. In one such embodiment, the semiconductor layer has a bandgap at least approximately 0.2 electron Volts (eV) greater than the bandgap of the semiconductor substrate. In an embodiment, the method further includes forming an emitter region for the solar cell from the semiconductor layer.

There may be processing advantages associated with one or more embodiments of the present invention. For example, one or more embodiments described herein provide a single-operation passivation process. One or more embodiments described herein provide an ability to use such passivation for fabricating a back N-type contact, simplifying a solar cell process sequence beyond the single-operation passivation process. One or more embodiments described herein provide an approach to having no atmospheric exposure of a formed oxide. One or more embodiments described herein provide an approach for forming a high optical reflectance contact. One or more embodiments described herein provide an approach requiring no need for opening a contact window in the back of an N-type contact. One or more embodiments described herein provide an approach for facilitating full area metal contact formation.

In accordance with an embodiment of the present invention, an improved technique for manufacturing solar cells is to provide a thin dielectric layer and a deposited wide band gap semiconductor layer on the back side of a silicon substrate in a single process tool. A detailed processing scheme is provided below in order to illustrate one of the many possible embodiments for forming a wide bandgap semiconductor material and semiconductor substrate pair for forming emitter regions. Specifically, FIGS. 4A-4L illustrate cross-sectional views of various stages in the fabrication of a solar cell having an emitter region composed of a wide bandgap semiconductor material, in accordance with another embodiment of the present invention.

As an overview, in the particular embodiment illustrated, regions of doped polysilicon are first formed by dopant driving into deposited silicon layers, or by in-situ formation of doped polysilicon regions. An oxide layer and a layer of a wide band gap doped semiconductor are then formed on the front and back sides of the solar cell, in a single process tool. One variant involves texturizing the front and back surfaces prior to formation of the oxide and wide band gap doped semiconductor formation. Contact holes may then be formed through the upper layers to expose the doped polysilicon regions. A metallization process may then be performed to form contacts onto the doped polysilicon layer. A second group of contacts may also be formed by directly connecting metal to emitter regions on the silicon substrate formed by the wide band gap semiconductor layer positioned between regions of the doped polysilicon on the back side of the solar cell. It is to be understood that embodiments of the present invention need not include all operations depicted and described, nor are embodiments limited to those depicted and described.

Figure 4A:
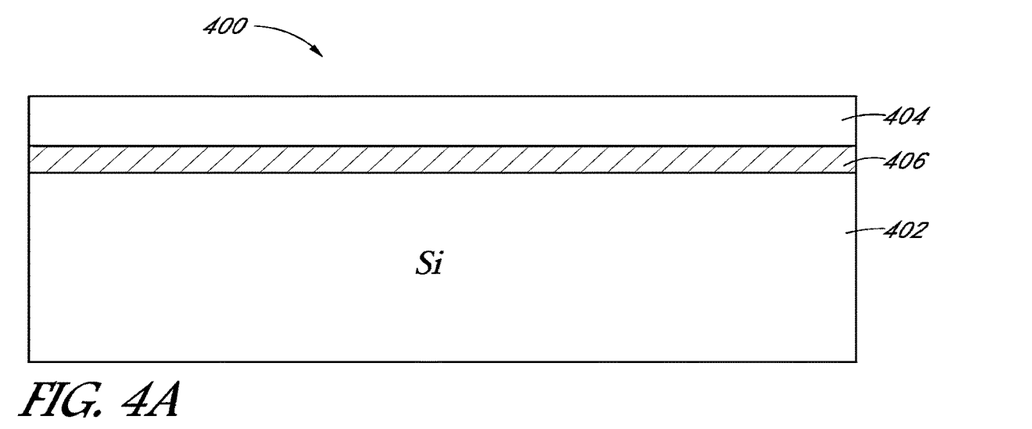
FIG. 4A illustrates a cross-sectional view of an operation in the fabrication of a solar cell wherein a foundational structure for fabricating a solar cell is provided and includes a silicon substrate, a thin dielectric layer, and a deposited silicon layer, in accordance with another embodiment of the present invention.

Referring to FIG. 4A, a foundational structure 400 for fabricating a solar cell includes a silicon substrate 402 (e.g., an N-type single crystalline substrate), a thin dielectric layer 406, and a deposited silicon layer 404. In some embodiments, the silicon substrate 402 is cleaned, polished, planarized, and/or thinned or otherwise processed prior to the formation of the thin dielectric layer 406. The thin dielectric layer 406 and deposited silicon layer 404 may be grown through a thermal process.

Figure 4B:
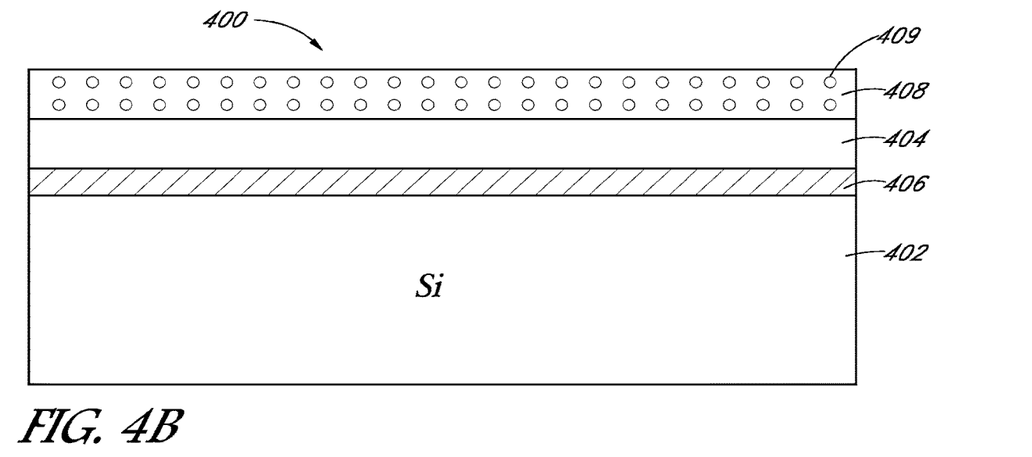
FIG. 4B illustrates a cross-sectional view of an operation in the fabrication of a solar cell wherein a layer of doping material is deposited over the deposited silicon layer of FIG. 4A, in accordance with another embodiment of the present invention.
Figure 4C:
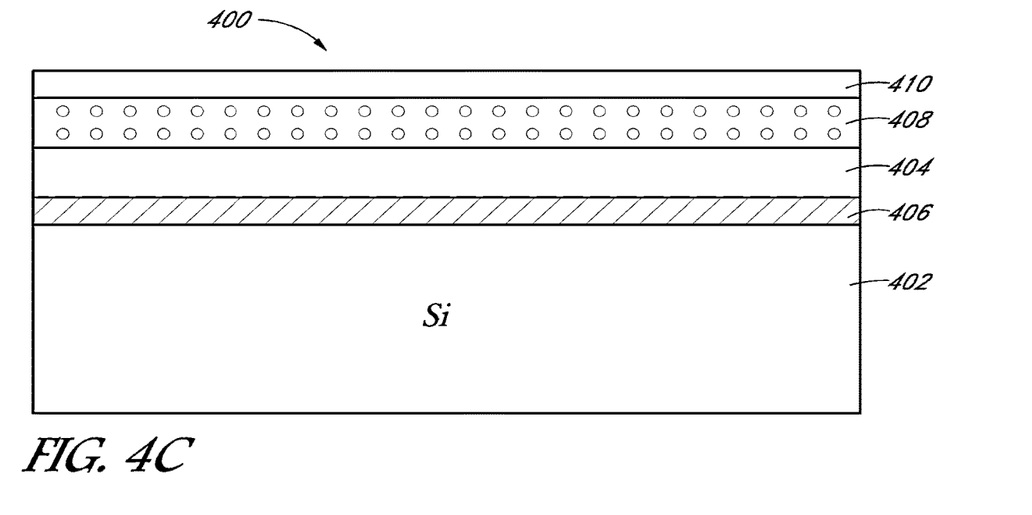
FIG. 4C illustrates a cross-sectional view of an operation in the fabrication of a solar cell wherein a first oxide layer 410 is deposited over the layer of doping material of FIG. 4B, in accordance with another embodiment of the present invention.

Referring to FIGS. 4B and 4C, a layer of doping material 408 followed by a first oxide layer 410 are deposited over the deposited silicon layer 404 through conventional deposition processes. The layer of doping material 408 may include a doping material, or dopant 409, and may be composed of, but is not limited to, a layer of positive-type doping material such as boron or a layer of negative-type doping material such as phosphorous or arsenic. Although the thin dielectric layer 406 and deposited silicon layer 404 are described as being grown by a thermal process or deposited through conventional deposition process, respectively, each layer may be formed using an appropriate process. For example, a chemical vapor deposition (CVD) process, low-pressure CVD (LPCVD), atmospheric pressure CVD (APCVD), plasma-enhanced CVD (PECVD), thermal growth, or sputtering process, or another suitable technique may be used. In one embodiment, the doping material 408 is formed on the substrate 402 by a deposition technique, sputter, or print process, such as inkjet printing or screen printing, or by ion implantation.

Figure 4D:
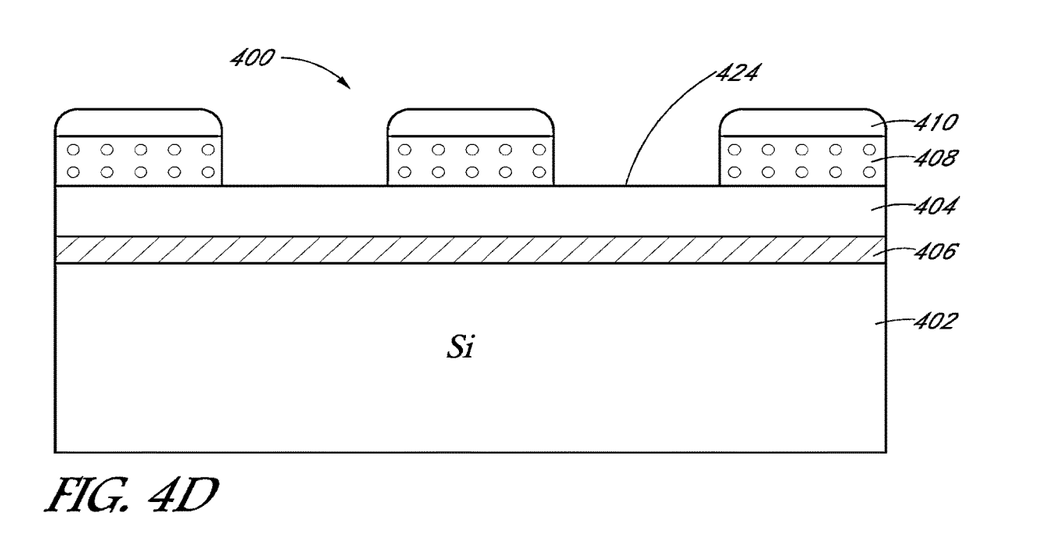
FIG. 4D illustrates a cross-sectional view of an operation in the fabrication of a solar cell wherein a material removal process is performed on the structure of FIG. 4C to form an exposed polysilicon region, in accordance with another embodiment of the present invention.

Referring to FIG. 4D, solar cell 400 is depicted following a material removal process applied to the structure of FIG. 4C. The material removal process forms an exposed polysilicon region 424. Suitable examples of a material removal process include a mask and etch process, a laser ablation process, and other similar techniques. The exposed polysilicon region 424 and layer of doping material 408 may be patterned to have a suitable shape and size for ultimate emitter formation. A suitable pattern layout may include, but is not limited to, formation of an interdigitated pattern. Where a masking process is used, it may be performed using a screen printer or an inkjet printer to apply a mask ink in predefined interdigitated pattern. Thus, conventional chemical wet etching techniques may be used to remove the mask ink resulting in the interdigitated pattern of exposed polysilicon regions 424 and layer of doping material 408. In one embodiment, portions or the entirety of the first oxide layer 410 are removed. Such removal may be accomplished in the same etching or ablation process in which regions of the deposited silicon layer 404, and dielectric layer 406 are removed.

Figure 4E:
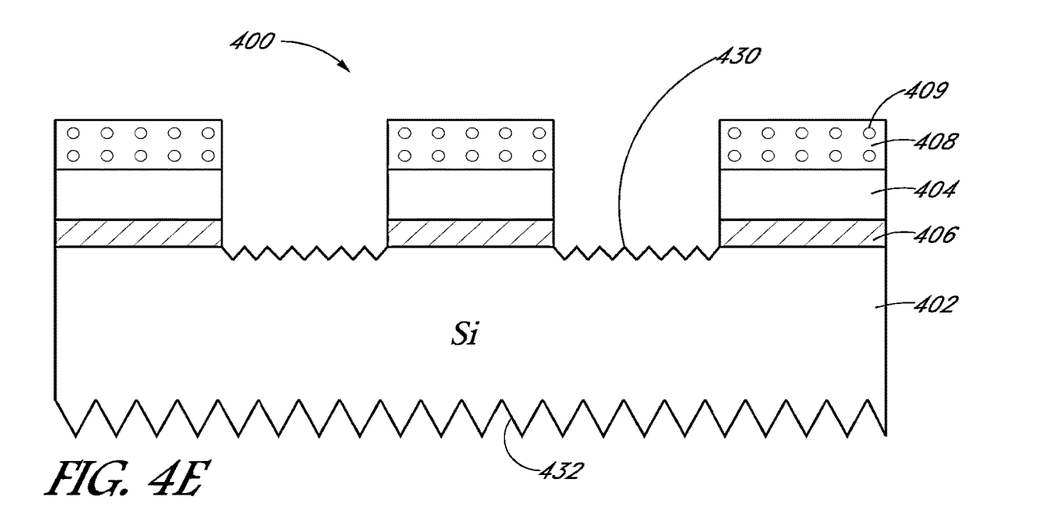
FIG. 4E illustrates a cross-sectional view of an operation in the fabrication of a solar cell wherein an etching process is performed on the structure of FIG. 4D to facilitate etching the exposed polysilicon regions and to form a first texturized silicon region on the back side of the solar cell, in accordance with another embodiment of the present invention.

Referring to FIG. 4E, a second etching process may be performed to facilitate etching the exposed polysilicon regions 424 and to form a first texturized silicon region 430 on the back side of the solar cell 400 and a second texturized silicon region 432 on the front side of the solar cell 400 for increased solar radiation collection. A texturized surface may be one which has a regular or an irregular shaped surface for scattering incoming light, decreasing the amount of light reflected off of the light-receiving surface of the solar cell 400.

Figure 4F:
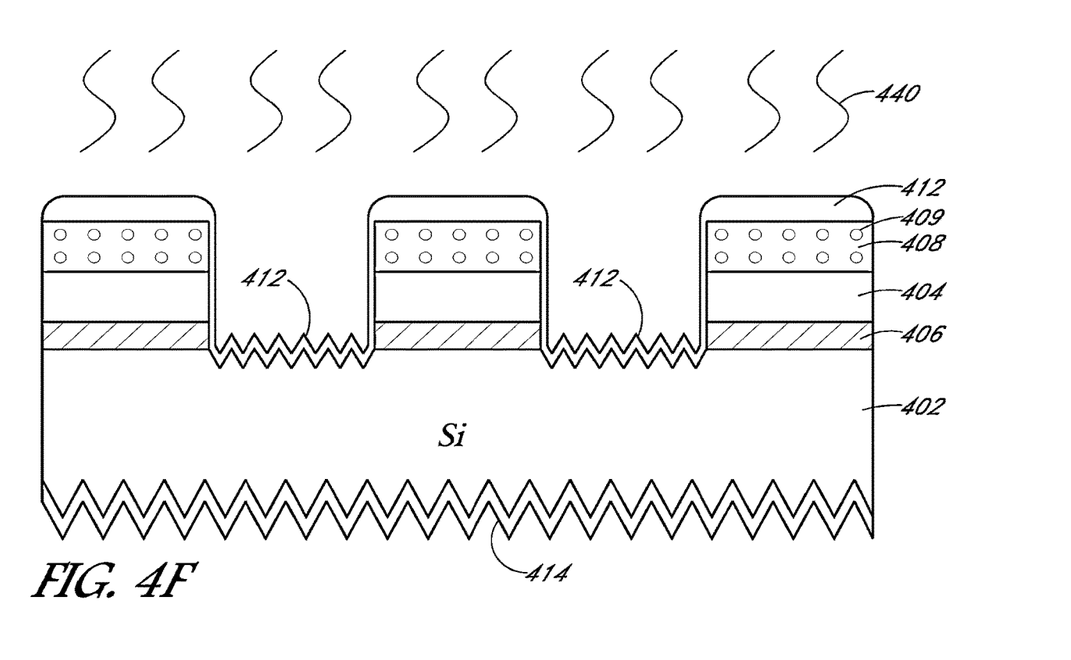
FIG. 4F illustrates a cross-sectional view of an operation in the fabrication of a solar cell wherein an oxide layer is formed over the layer of doping material and first texturized silicon region of FIG. 4E, in accordance with another embodiment of the present invention.

Referring to FIG. 4F, the solar cell 400 may be heated 440 to drive the doping material 409 from the layer of doping material 408 into the deposited silicon layer 404. The same heating 440 may also form a silicon oxide or a second oxide layer 412 over the layer of doping material 408 and first texturized silicon region 430. During this process, a third oxide layer 414 may be grown over the second texturized silicon region 432. In one embodiment, both the oxide layers 412, 414 are composed of a high quality oxide. In a specific such embodiment, a high-quality oxide is a low interface state density oxide typically grown by thermal oxidation at temperatures greater than approximately 900 degrees Celsius and which can provide for improved passivation of exposed regions of substrate 402.

Thus, in an embodiment, at least a portion of the second oxide layer 412 is formed by consuming a portion of the semiconductor substrate 402 by thermal oxidation. In one such embodiment, consuming the portion of the semiconductor substrate 402 includes thermally oxidizing a portion of a single-crystalline N-type silicon substrate to form a silicon dioxide ($SiO_2$) 412 layer having a thickness of approximately 3 nanometers or less on the exposed surfaces of the silicon substrate. In an alternative embodiment, a thin dielectric layer is formed on the first texturized silicon region 430 by depositing a dielectric material layer on the first texturized silicon region 430. In one such embodiment, the depositing involves forming an aluminum oxide ($Al_2O_3$) layer on the surface of a single-crystalline N-type silicon substrate. In a specific such embodiment, the aluminum oxide ($Al_2O_3$) layer is an amorphous aluminum oxide ($Al_2O_3$) layer. Such embodiments may be performed by, e.g., atomic layer deposition (ALD), or other suitable deposition techniques.

Figure 4G:
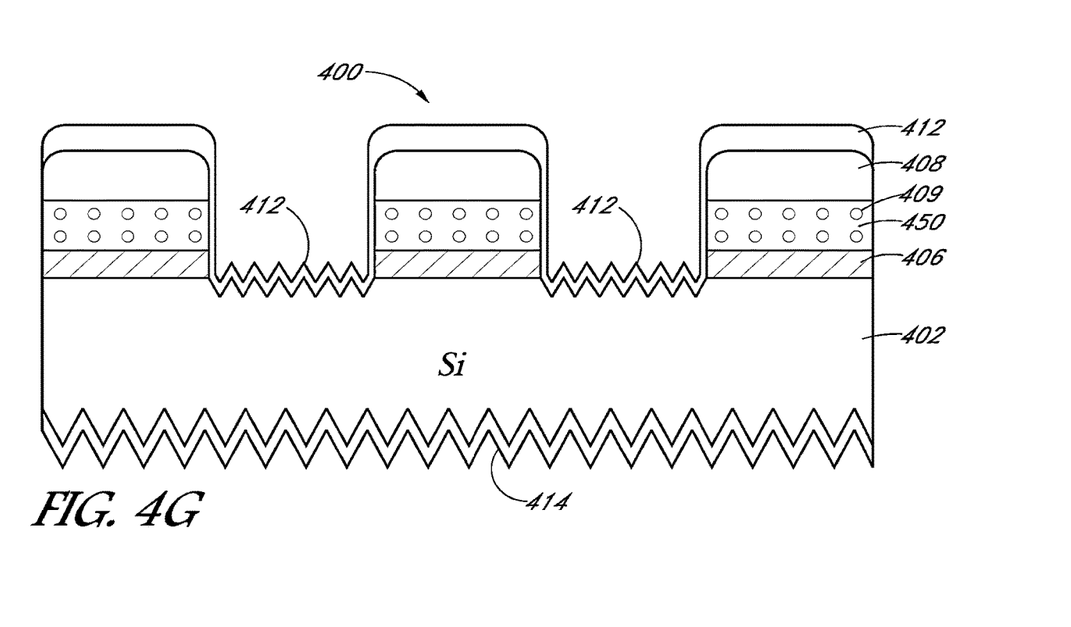
FIG. 4G illustrates a cross-sectional view of an operation in the fabrication of a solar cell wherein a doped polysilicon layer is formed from the structure of FIG. 4F, in accordance with another embodiment of the present invention.

Referring to FIG. 4G, in one embodiment, forming a doped polysilicon layer may be accomplished during the formation of oxide layers 412, 414 while simultaneously raising the temperature to drive the dopants 409 from the layer of doping material 408 into the deposited silicon layer 404. In one such embodiment, doping the deposited silicon layer 404 with dopants 409 from the layer of doping material 408 forms a crystallized doped polysilicon layer or a doped polysilicon layer 450. In a specific such embodiment, the doped polysilicon layer 450 is a layer of positively doped polysilicon if a positive-type doping material is used. In a particular such embodiment, the silicon substrate 402 is composed of a bulk N-type silicon substrate. In another specific embodiment, the doped polysilicon layer 450 is a layer of negatively doped polysilicon if a negative-type doping material is used. In a particular such embodiment, the silicon substrate 102 is composed of a bulk P-type silicon substrate. Overall, then, the deposited silicon layer 404 may therefore be doped with the doping material 409 from the layer of dopant material 408 to form a doped polysilicon layer 450.

Figure 4H:
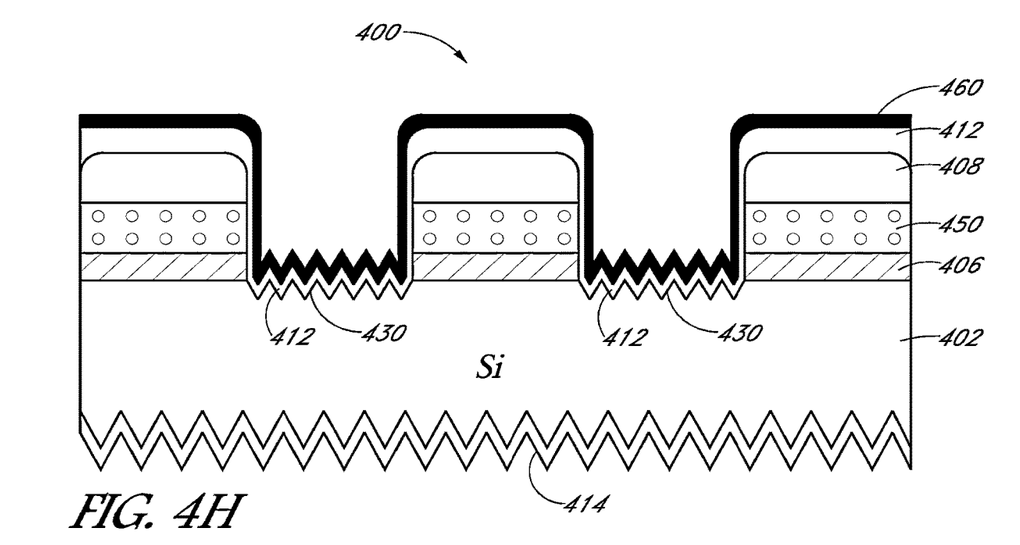
FIG. 4H illustrates a cross-sectional view of an operation in the fabrication of a solar cell wherein a wide band gap doped semiconductor layer is formed on the structure of FIG. 4G, in accordance with another embodiment of the present invention.

Referring to FIG. 4H, without removing the substrate 402 from the controlled atmosphere of the process tool used to form oxide layers 412, 414, a first wide band gap doped semiconductor layer 460 is deposited on the back side of the solar cell 400. In an embodiment, the first wide bandgap semiconductor layer 460 has a bandgap at least approximately 0.2 electron Volts (eV) above the bandgap of the semiconductor substrate 402. For example, the first wide bandgap semiconductor layer 460 may have a bandgap at least approximately 0.2 electron Volts (eV) above the bandgap of an N-type single crystalline silicon substrate with a bandgap of approximately 1.0 eV. In one such embodiment, the first wide bandgap semiconductor layer 460 is substantially transparent in the visible spectrum. In a specific such embodiment, the first wide bandgap semiconductor layer 460 has a bandgap greater than approximately 3 eV and is composed of a material such as, but not limited to, aluminum nitride (AlN), aluminum gallium nitride ($Al_xGa_{1-x}N$, where $0<x<1$), boron nitride (BN), 4H-phase silicon carbide (SiC) (approximately 3.23 eV), or 6H-phase silicon carbide (SiC) (approximately 3.05 eV). In another embodiment, the semiconductor substrate 402 is composed of single-crystalline N-type silicon and the first wide bandgap semiconductor layer 460 has a bandgap greater than approximately 1.5 eV and is composed of a material such as, but not limited to, amorphous silicon (a-Si, approximately 1.5 eV), silicon carbide (SiC, different phases above approx 2.0 eV), aluminum nitride (AlN), aluminum gallium nitride ($Al_xGa_{1-x}N$, where $0<x<1$), or boron nitride (BN).

In an embodiment, forming oxide layers 412, 414 and the first wide bandgap semiconductor layer 460 in the same process tool involves using a low pressure chemical vapor deposition (LPCVD) chamber, a rapid thermal anneal (RTA) chamber, a rapid thermal processing (RTP) chamber, an atmospheric pressure chemical vapor deposition (APCVD) chamber, a hydride vapor phase epitaxy (HVPE) chamber, or both of an RTP chamber and a plasma enhanced chemical vapor deposition (PECVD) chamber. In an embodiment, the "same" process tool may be a single or multi-chamber process tool, so long as the atmosphere is a controlled atmosphere different from the atmosphere of the facility housing the process tool.

In an embodiment, the method further doping the first wide bandgap semiconductor layer 460 with charge carrier dopant impurity atoms having a concentration approximately in the range of $1\times10^{17}$-$1\times10^{21}$ atoms/cm$^3$. In one such embodiment, the doping is performed in situ during the forming of the first wide bandgap semiconductor layer 460. In an alternative such embodiment, the doping is performed subsequent to the forming of the first wide bandgap semiconductor layer 460.

Figure 4I:
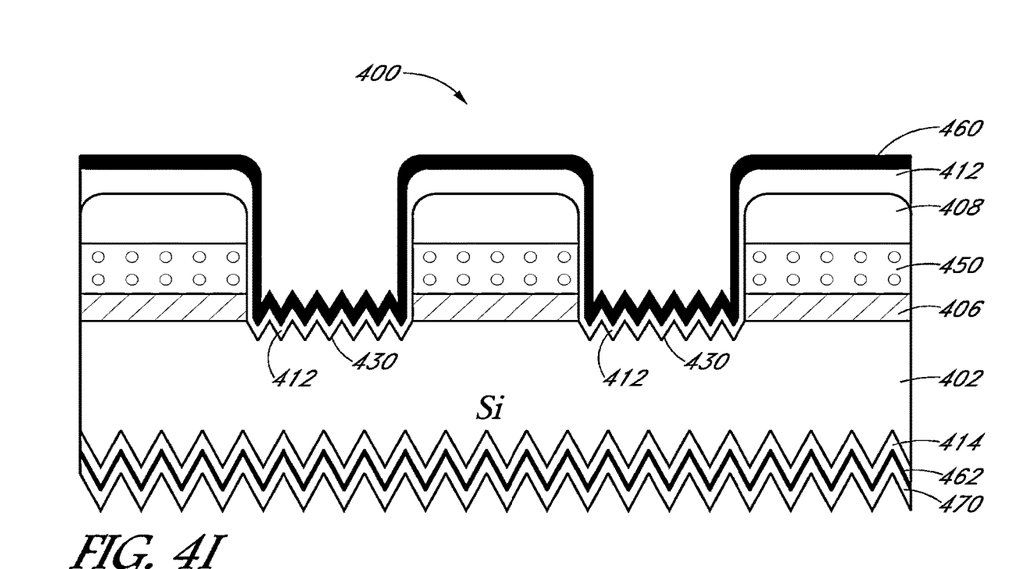
FIG. 4I illustrates a cross-sectional view of an operation in the fabrication of a solar cell wherein a wide band gap doped semiconductor is deposited over the texturized silicon region of FIG. 4H, in accordance with another embodiment of the present invention.

Referring to FIG. 4I, a second wide band gap doped semiconductor layer 462 may be deposited over the second texturized silicon region 432 on the front side of the solar cell 400. In an embodiment, the layers 460 and 462 are formed in the same process operation. In another embodiment, however, the layers 460 and 462 are formed in different process operations, in a same or different process tool. In one embodiment, both the wide band gap doped semiconductor layers 460, 462 on the back side and front side of the solar cell 400 are composed of a wide band gap negative-type doped semiconductor. In one embodiment, the second wide band gap doped semiconductor 462 is relatively thin as compared to the first thick wide band gap doped semiconductor layer 460. In a specific such embodiment, the second thin wide band gap doped semiconductor layer 462 is approximately 10% to 30% of the thickness of the first thick wide band gap doped semiconductor layer 460. In another embodiment, both wide band gap doped semiconductor layers 460, 462 on the back side and front side of the solar cell 400 are composed of a wide band gap positive-type doped semiconductor. Subsequently, an anti-reflective coating (ARC) layer 470 may be deposited over the second wide band gap doped semiconductor 462, as depicted in FIG. 4I. In one such embodiment, the ARC layer 470 is composed of silicon nitride.

Figure 4J:
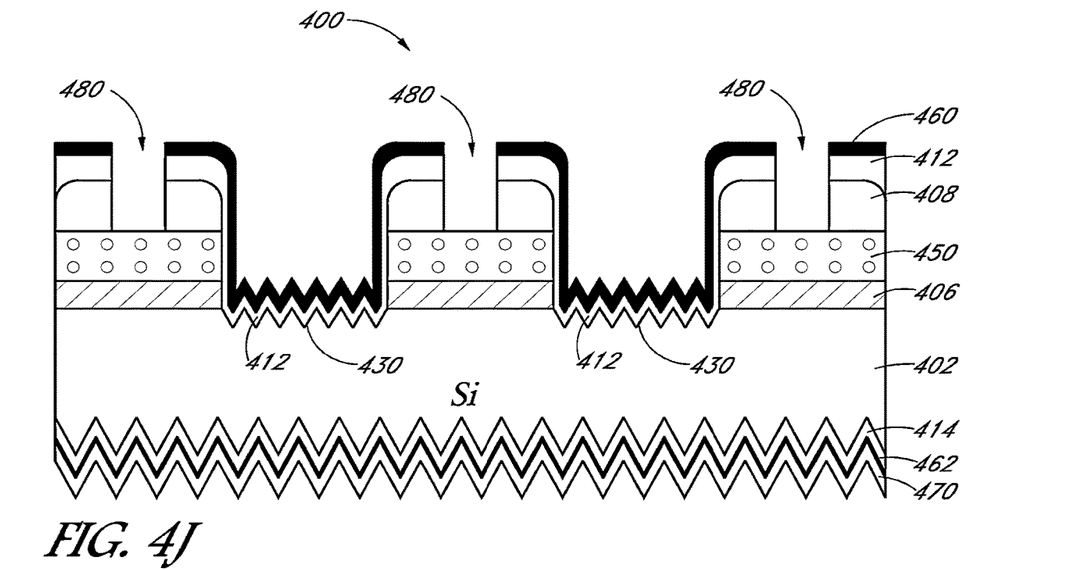
FIG. 4J illustrates a cross-sectional view of an operation in the fabrication of a solar cell wherein partial removal of the wide band gap doped semiconductor of FIG. 4H is performed, in accordance with another embodiment of the present invention.

Referring to FIG. 4J, partial removal of the first wide band gap doped semiconductor 460, second oxide layer 412 and the layer of doping material 408 on the back side of the solar cell 400 is performed to form a series of contact openings 480. In one embodiment, the removal technique is accomplished using an ablation process. One such ablation process is a laser ablation process. In another embodiment, the removal technique is a conventional patterning process, such as screen printing or ink jet printing of a mask followed by an etching process. In an embodiment, forming the first wide bandgap semiconductor layer 460 includes forming a portion over at least a portion of the doped polysilicon layer 450, even after patterning of the doped polysilicon layer 450, as depicted in FIG. 4J.

Figure 4K:
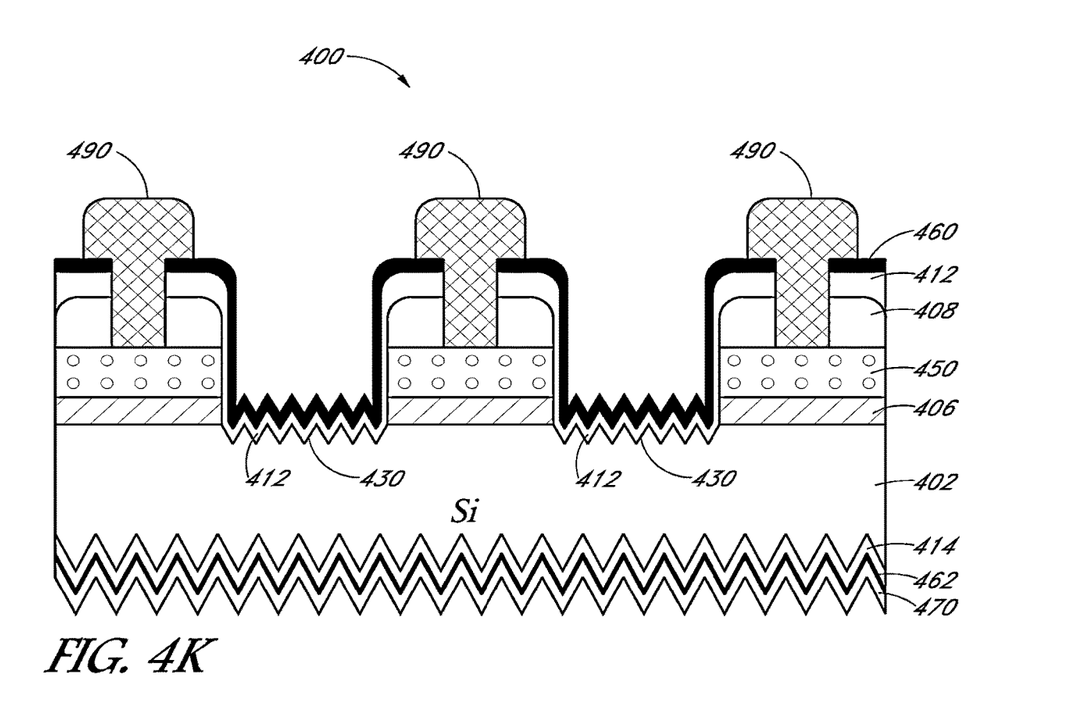
FIG. 4K illustrates a cross-sectional view of an operation in the fabrication of a solar cell wherein a first metal grid or gridline is formed on the back side of the structure of FIG. 4J, in accordance with another embodiment of the present invention.

Referring to FIG. 4K, a first metal grid or gridline 490 is formed on the back side of the solar cell 400. The first metal gridline 490 may be electrically coupled to the doped polysilicon 450 within the contact openings 480. In one embodiment, the first metal gridline 490 is formed through the contact openings 480 to the first wide band gap doped semiconductor 460, second oxide layer 412, and the layer of doping material 408 to connect a positive electrical terminal of an external electrical circuit to be powered by the solar cell 400.

Figure 4L:
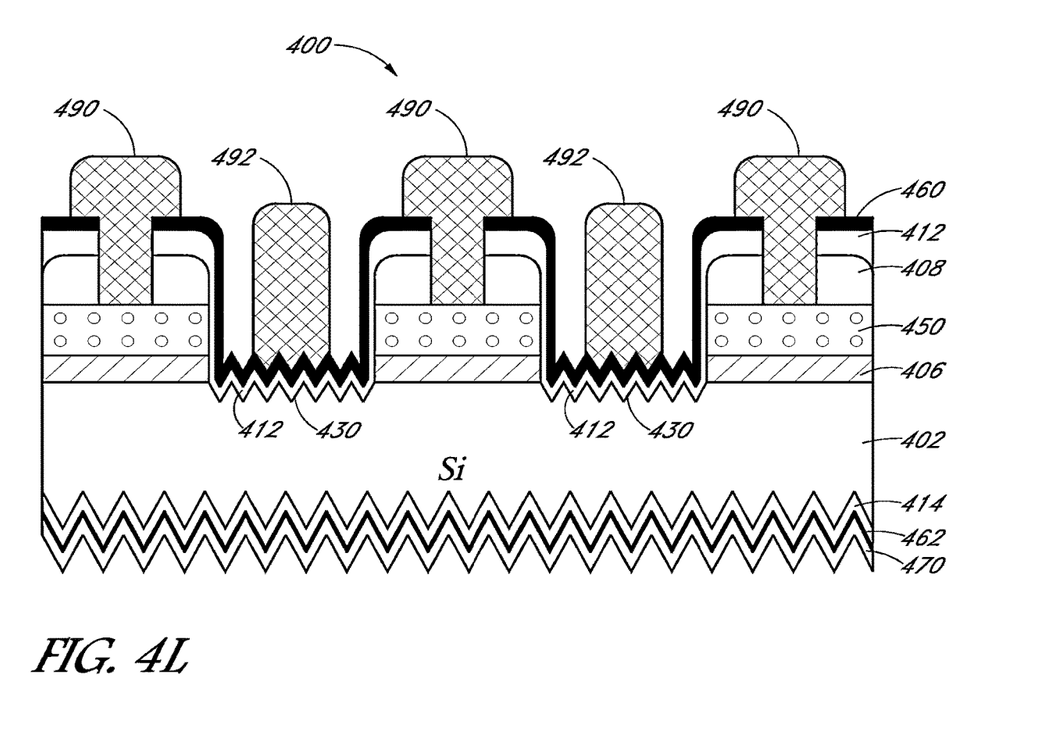
FIG. 4L illustrates a cross-sectional view of an operation in the fabrication of a solar cell wherein a second metal grid or gridline is formed on the back side of the structure of FIG. 4K, in accordance with another embodiment of the present invention.

Referring to FIG. 4L, a second metal grid or gridline 492 is formed on the back side of the solar cell 400. The second metal gridline 492 may be electrically coupled to the second texturized silicon region 432. In one embodiment, the second metal gridline 492 is coupled to the first wide band gap doped semiconductor 460, second oxide layer 412, and the first texturized silicon region 430 acting as a heterojunction in areas of the back side of the solar cell 400 to connect to a negative electrical terminal of an external electrical circuit to be powered by the solar cell 400. In some embodiments, the forming of metal grid lines referenced in FIGS. 4K and 4L are performed through an electroplating process, screen printing process, ink jet process, plating onto a metal formed from aluminum metal nanoparticles, or other metallization or metal formation processing operation.

Thus, in an embodiment, a first emitter region is formed from doped polycrystalline silicon, while a second emitter region is formed from a wide bandgap semiconductor material. In another embodiment, however, instead of doped polysilicon, the first emitter regions is also formed from a material having a bandgap at least approximately 0.2 electron Volts (eV) above the bandgap of 402, e.g., above a single-crystalline N-type silicon substrate.

In another aspect, as described above, with reference to FIG. 4F, some embodiments include the use of a more exotic oxide layer as a passivating layer between a substrate and wide bandgap interface. In an exemplary embodiment, one such solar cell includes a silicon substrate. A first emitter region is disposed on a surface of the silicon substrate and is composed of an aluminum nitride (AlN) layer doped to a first conductivity type. The AlN layer is disposed on a thin aluminum oxide ($Al_2O_3$) layer. A second emitter region is disposed on the surface of the silicon substrate and is composed of a semiconductor material doped to a second, opposite, conductivity type. The second semiconductor material is disposed on a thin dielectric layer. First and second contacts are disposed on, and conductively coupled to, the first and second emitter regions, respectively.

In one such embodiment, the semiconductor material has a bandgap at least approximately 0.2 electron Volts (eV) above the bandgap of the silicon substrate. That is, both types of emitter regions include wide band gap materials. However, in another such embodiment, the semiconductor material is composed of polycrystalline silicon, e.g., similar to the structures described in association with FIGS. 4A-4K. In an embodiment, the first emitter region is disposed on a textured portion of the surface of the silicon substrate, and the second emitter region is disposed on a flat portion of the surface of the silicon substrate.

In one embodiment, the first and second emitter regions are disposed on a back-contact surface of the semiconductor substrate. The silicon substrate further includes a light-receiving surface opposite the back-contact surface. The light-receiving surface has a thin aluminum oxide ($Al_2O_3$) layer disposed thereon, and an aluminum nitride (AlN) layer disposed on the thin aluminum oxide ($Al_2O_3$) layer. In one embodiment, a portion of the aluminum nitride (AlN) layer is disposed over at least a portion of the second emitter region, similar to the structure described in association with FIG. 4J.

Several embodiments described herein include forming emitter regions for solar cells by providing a thin dielectric layer and a deposited wide band gap semiconductor layer on the back side of a silicon substrate in a single process tool. It is to be understood that other embodiments need not be limited there to. For example, in an embodiment, a passivation layer for a solar cell is formed by providing a thin dielectric layer and a deposited wide band gap semiconductor layer on the front and back sides of a silicon substrate in a single process tool. An emitter region need not be formed from the passivation layer.

Thus, solar cells having emitter regions composed of wide bandgap semiconductor material and methods of fabricating solar cells have been disclosed. In accordance with an embodiment of the present invention, a method includes forming a thin dielectric layer on a surface of a semiconductor substrate of the solar cell in a process tool having a controlled atmosphere. The semiconductor substrate has a bandgap. A semiconductor layer is then formed on the thin dielectric layer without removing the semiconductor substrate from the controlled atmosphere of the process tool. The semiconductor layer has a bandgap at least approximately 0.2 electron Volts (eV) above the bandgap of the semiconductor substrate. In one such embodiment, the method further includes forming an emitter region for the solar cell from the semiconductor layer. In another such embodiment, forming the semiconductor layer involves forming a layer substantially transparent in the visible spectrum.

What is claimed is:

1. A solar cell, comprising:
a semiconductor substrate;
a first thin dielectric layer disposed on the semiconductor substrate;
a first semiconductor region of a first conductivity type disposed on the first thin dielectric layer;
a second thin dielectric layer disposed on the semiconductor substrate; and
a second semiconductor region of a second conductivity type disposed on the second thin dielectric layer, the second conductivity type opposite the first conductivity type, wherein the second thin dielectric layer is disposed on a sidewall surface of the first semiconductor region, and the second dielectric layer laterally separates the first and second semiconductor regions.

2. The solar cell of claim 1, wherein the first semiconductor region is a first polysilicon region, and the second semiconductor region is a second polysilicon region.

3. The solar cell of claim 1, wherein the first thin dielectric layer is a first oxide layer, and the second thin dielectric layer is a second oxide layer.

4. The solar cell of claim 3, wherein the first oxide layer and the second oxide layer comprise silicon.

5. The solar cell of claim 1, wherein the second thin dielectric layer covers at least a portion of the first semiconductor region.

6. The solar cell of claim 1, wherein the second thin dielectric layer and the second semiconductor region include a contact opening through which a metal contact is formed to contact to the first semiconductor region.

7. The solar cell of claim 1, wherein the first conductivity type is N-type, and the second conductivity type is P-type.

8. The solar cell of claim 1, wherein the first conductivity type is P-type, and the second conductivity type is N-type.

9. The solar cell of claim 1, wherein the second semiconductor region has a dopant concentration approximately in the range of $1 \times 10^{17}$-$1 \times 10^{21}$ atoms/cm$^3$.

10. The solar cell of claim 1, further comprising:
an oxide layer disposed over a light receiving surface of the semiconductor substrate, the light receiving surface opposite the first thin dielectric layer and the second thin dielectric layer;
an amorphous silicon layer disposed on the oxide layer; and
an anti-reflective coating (ARC) layer disposed on the amorphous silicon layer, the ARC layer comprising silicon nitride.

11. A solar cell, comprising:
a silicon substrate;
a first dielectric layer on the silicon substrate;
a first silicon region of a first conductivity type on the first dielectric layer;
a second dielectric layer on the silicon substrate; and
a second silicon region of a second conductivity type on the second dielectric layer, the second conductivity type opposite the first conductivity type, wherein the second dielectric layer is on a sidewall surface of the first silicon region, and the second dielectric layer laterally separates the first and second silicon regions.

12. The solar cell of claim 11, wherein the first silicon region is a first polysilicon region, and the second silicon region is a second polysilicon region.

13. The solar cell of claim 11, wherein the first dielectric layer is a first oxide layer, and the second dielectric layer is a second oxide layer.

14. The solar cell of claim 13, wherein the first oxide layer and the second oxide layer comprise silicon.

15. The solar cell of claim 11, wherein the second dielectric layer covers at least a portion of the first silicon region.

16. The solar cell of claim 11, wherein the second dielectric layer and the second silicon region include a contact opening through which a metal contact is formed to contact to the first silicon region.

17. The solar cell of claim 11, wherein the first conductivity type is N-type, and the second conductivity type is P-type.

18. The solar cell of claim 11, wherein the first conductivity type is P-type, and the second conductivity type is N-type.

19. The solar cell of claim 11, wherein the second silicon region has a dopant concentration approximately in the range of $1 \times 10^{17}$-$1 \times 10^{21}$ atoms/cm$^3$.

20. The solar cell of claim 11, further comprising:
an oxide layer over a light receiving surface of the silicon substrate, the light receiving surface opposite the first dielectric layer and the second dielectric layer;
an amorphous silicon layer on the oxide layer; and
an anti-reflective coating (ARC) layer on the amorphous silicon layer, the ARC layer comprising silicon nitride.

21. A solar cell, comprising:
a semiconductor substrate;
a first thin dielectric layer disposed on the semiconductor substrate;
a first semiconductor region of a first conductivity type disposed on the first thin dielectric layer;
a second thin dielectric layer disposed on the semiconductor substrate; and
a second semiconductor region of a second conductivity type disposed on the second thin dielectric layer, the second conductivity type opposite the first conductivity type, wherein the second thin dielectric layer is disposed on a lateral surface of the first semiconductor region, and the second dielectric layer separates the first and second semiconductor regions, wherein the second semiconductor region has a dopant concentration approximately in the range of $1 \times 10^{17}$-$1 \times 10^{21}$ atoms/cm$^3$.

22. A solar cell, comprising:
a semiconductor substrate;
a first thin dielectric layer disposed on the semiconductor substrate;
a first semiconductor region of a first conductivity type disposed on the first thin dielectric layer;
a second thin dielectric layer disposed on the semiconductor substrate;
a second semiconductor region of a second conductivity type disposed on the second thin dielectric layer, the second conductivity type opposite the first conductivity type, wherein the second thin dielectric layer is disposed on a lateral surface of the first semiconductor region, and the second dielectric layer separates the first and second semiconductor regions;
an oxide layer disposed over a light receiving surface of the semiconductor substrate, the light receiving surface opposite the first thin dielectric layer and the second thin dielectric layer;
an amorphous silicon layer disposed on the oxide layer; and
an anti-reflective coating (ARC) layer disposed on the amorphous silicon layer, the ARC layer comprising silicon nitride.

* * * * *